US012635068B2

(12) United States Patent
Gao et al.

(10) Patent No.: US 12,635,068 B2
(45) Date of Patent: May 19, 2026

(54) PRINTED CIRCUIT BOARD AND PREPARATION METHOD THEREOF, AND ELECTRONIC COMMUNICATION DEVICE

(71) Applicant: HUAWEI TECHNOLOGIES CO., LTD., Shenzhen (CN)

(72) Inventors: Feng Gao, Dongguan (CN); Shichao Tao, Dongguan (CN); Mingli Huang, Dongguan (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 238 days.

(21) Appl. No.: 18/350,812

(22) Filed: Jul. 12, 2023

(65) Prior Publication Data

US 2023/0354506 A1      Nov. 2, 2023

Related U.S. Application Data

(63) Continuation of application No. PCT/CN2022/071672, filed on Jan. 12, 2022.

(30) Foreign Application Priority Data

Jan. 13, 2021    (CN) .......................... 202110045155.7

(51) Int. Cl.
 H05K 1/11 (2006.01)
 H05K 1/02 (2006.01)
 (Continued)

(52) U.S. Cl.
 CPC ............. H05K 1/024 (2013.01); H05K 1/115 (2013.01); H05K 3/0047 (2013.01); H05K 3/42 (2013.01);
 (Continued)

(58) Field of Classification Search
 CPC .................. H05K 1/024; H05K 1/115; H05K 2201/0355; H05K 2201/10098;
 (Continued)

(56) References Cited

U.S. PATENT DOCUMENTS 5,785,787 A *   7/1998   Wojnarowski ......... H05K 1/024
                                                        29/829
2002/0000932 A1*  1/2002   Metzen ................. H01P 11/003
                                                        343/846
(Continued)

FOREIGN PATENT DOCUMENTS

CN          1735318 A       2/2006
CN        102036476 A       4/2011
            (Continued)

OTHER PUBLICATIONS

International Search Report dated Mar. 2, 2022, issued for International Application No. PCT/CN2022/071672 (10 pages).
(Continued)

*Primary Examiner* — Roshn K Varghese

(57) ABSTRACT

A printed circuit board, which may be included an electronic communication device, includes a substrate, a bonding layer, a copper foil, and a filler. The substrate is provided with a cavity, and the cavity penetrates through the substrate. Two surfaces of the substrate are covered with the copper foil. The copper foil is bonded to the substrate by using the bonding layer. An outer surface of the copper foil is plated with a conductive metal layer. The filler is located inside the cavity. The substrate is provided with a through hole, and the through hole penetrates through the substrate and the bonding layer. A hole wall of the through hole is plated with a conductive metal layer. In this application, a dielectric constant Dk and a dielectric loss Df of the printed circuit board can be effectively reduced, and cost control is ensured.

18 Claims, 6 Drawing Sheets

(51) Int. Cl.
   H05K 3/00 (2006.01)
   H05K 3/42 (2006.01)
(52) U.S. Cl.
   CPC ................ *H05K 2201/0355* (2013.01); *H05K 2201/10098* (2013.01)
(58) Field of Classification Search
   CPC ... H05K 2201/0116; H05K 2201/0187; H05K 2201/0341; H05K 2201/0347; H05K 2201/09581; H05K 2201/0959
   See application file for complete search history.

(56) References Cited

U.S. PATENT DOCUMENTS

| | | | |
|---|---|---|---|
| 2012/0024586 A1* | 2/2012 | Yoshimura | H05K 1/036 29/852 |
| 2013/0240259 A1* | 9/2013 | Yoshimura | H05K 3/4608 174/266 |
| 2014/0174940 A1 | 6/2014 | Lim et al. | |
| 2020/0315020 A1* | 10/2020 | Armitage | H05K 3/422 |

FOREIGN PATENT DOCUMENTS

| | | |
|---|---|---|
| CN | 107666764 A | 2/2018 |
| CN | 109496223 A | 3/2019 |
| CN | 111132476 A | 5/2020 |
| EP | 4131638 A1 | 2/2023 |
| JP | H04368005 A | 12/1992 |
| WO | 0180347 A1 | 10/2001 |

OTHER PUBLICATIONS

Office Action dated Jun. 28, 2024, issued for European Application No. 22739061.4 (18 pages).

* cited by examiner

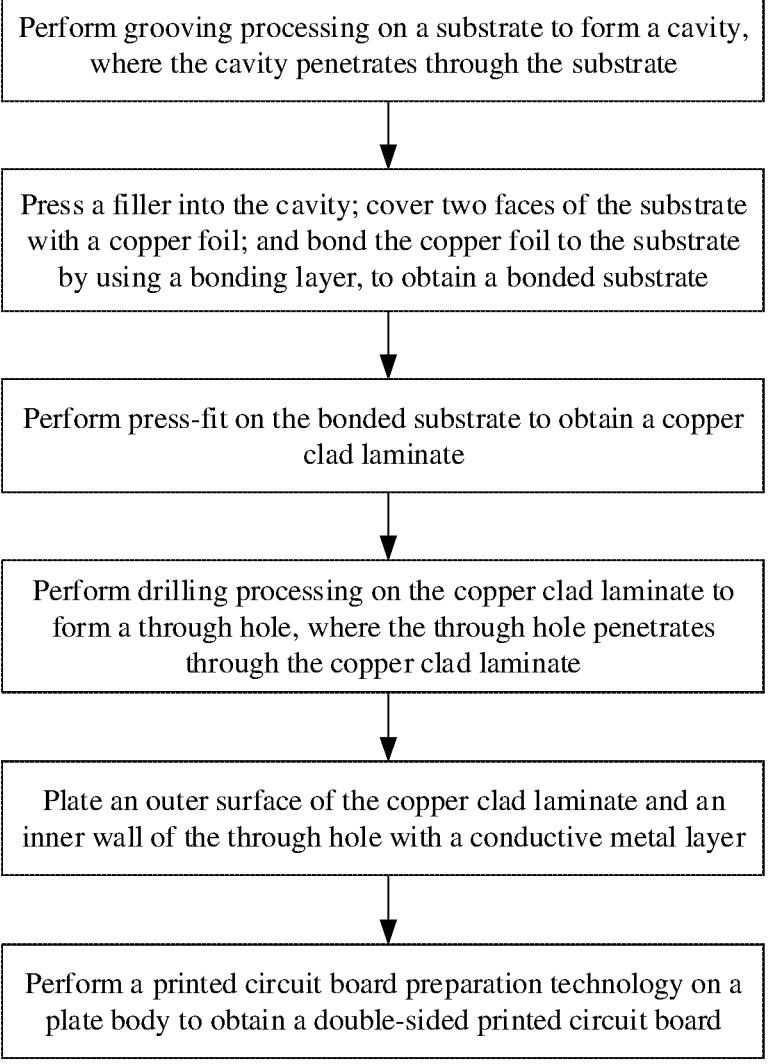

Perform grooving processing on a substrate to form a cavity, where the cavity penetrates through the substrate Press a filler into the cavity; cover two faces of the substrate with a copper foil; and bond the copper foil to the substrate by using a bonding layer, to obtain a bonded substrate Perform press-fit on the bonded substrate to obtain a copper clad laminate Perform drilling processing on the copper clad laminate to form a through hole, where the through hole penetrates through the copper clad laminate Plate an outer surface of the copper clad laminate and an inner wall of the through hole with a conductive metal layer Perform a printed circuit board preparation technology on a plate body to obtain a double-sided printed circuit board

FIG. 2

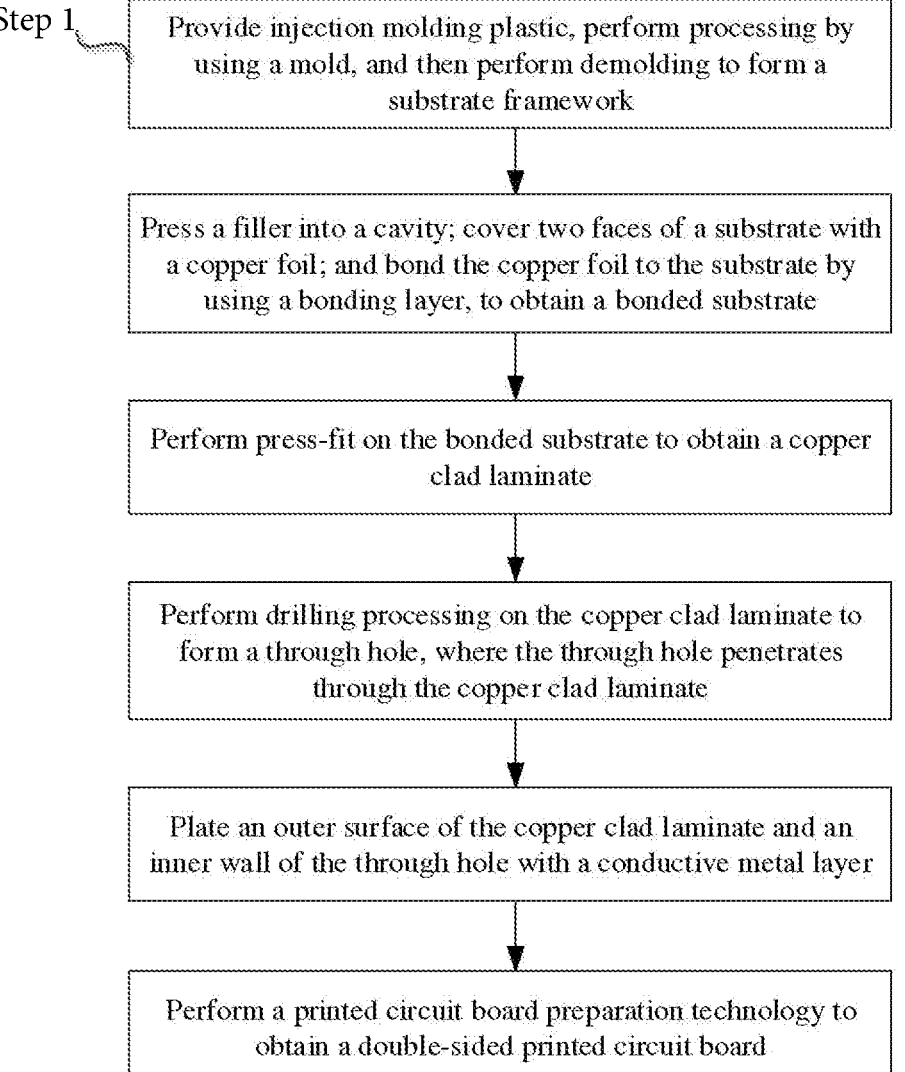

Step 1

Provide injection molding plastic, perform processing by using a mold, and then perform demolding to form a substrate framework Press a filler into a cavity; cover two faces of a substrate with a copper foil; and bond the copper foil to the substrate by using a bonding layer, to obtain a bonded substrate Perform press-fit on the bonded substrate to obtain a copper clad laminate Perform drilling processing on the copper clad laminate to form a through hole, where the through hole penetrates through the copper clad laminate Plate an outer surface of the copper clad laminate and an inner wall of the through hole with a conductive metal layer Perform a printed circuit board preparation technology to obtain a double-sided printed circuit board

FIG. 3

PRINTED CIRCUIT BOARD AND PREPARATION METHOD THEREOF, AND ELECTRONIC COMMUNICATION DEVICE

CROSS-REFERENCE TO RELATED APPLICATIONS

This application is a continuation of International Application No. PCT/CN2022/071672, filed on Jan. 12, 2022, which claims priority to Chinese Patent Application No. 202110045155.7, filed on Jan. 13, 2021. The disclosures of the aforementioned applications are hereby incorporated by reference in their entireties.

TECHNICAL FIELD

This disclosure relates to the field of board engineering, and in particular, to a printed circuit board and a preparation method thereof, and an electronic communication device.

BACKGROUND

A printed circuit board, also referred to as a printed wire board, is commonly abbreviated in English as a PCB (Printed Circuit Board) or a PWB (Printed Wire Board). It is a support device of an electronic element. In the printed circuit board, a metal conductor is used as a line for connecting electronic parts and components.

With rapid development of technologies such as cloud computing and the Internet of Things, the communication industry imposes an increasingly high requirement on a signal transmission rate. A conventional PCB mainly provides an electrical connection function in the field of communication antennas. In high-speed signal transmission, a dielectric loss caused by a transmission line of the PCB affects a signal transmission rate and signal transmission quality. Therefore, how to further reduce a dielectric loss caused by a material of an antenna PCB to improve signal transmission quality and a signal transmission rate brings a great challenge to current design of antenna PCBs.

SUMMARY

For the technical problems described in the background above, this disclosure provides a printed circuit board and a preparation method thereof, and an electronic communication device, so as to further reduce a dielectric loss of the printed circuit board while ensuring cost control.

According to a first aspect, a printed circuit board is provided. The printed circuit board includes a substrate, a bonding layer, a copper foil, and a filler, where
  the substrate is provided with a cavity, and the cavity penetrates through the substrate;
  two surfaces of the substrate are covered with the copper foil;
  the copper foil is bonded to the substrate by using the bonding layer;
  an outer surface of the copper foil is plated with a conductive metal layer;
  the filler is located inside the cavity;
  the substrate is provided with a through hole, and the through hole penetrates through the substrate and the bonding layer; and
  a hole wall of the through hole is plated with a conductive metal layer.
Specifically, the substrate is provided with the cavity, and the filler may be pressed into the cavity, or an empty-cavity state may be maintained. In the empty-cavity state, a dielectric constant Dk and a dielectric loss Df of the printed circuit board prepared by using the substrate can be effectively reduced, thereby improving radio frequency performance and radio frequency efficiency. Similarly, the filler may be any material that can reduce the dielectric constant Dk and dielectric loss Df, so that Dk<2.0, and Df<0.001. This also improves the radio frequency performance and the radio frequency efficiency. In addition, a size of the cavity or the filler may be adjusted based on a thickness of the substrate, and there is a correlation between a dielectric size and the dielectric constant Dk and dielectric loss Df. Therefore, the substrate enables autonomous adjustment on the dielectric constant Dk and the dielectric loss Df, so that a design degree of freedom is higher.

In an example, after the copper foil is bonded to the substrate by using the bonding layer, a press-fit technology is performed to obtain a copper clad laminate (CCL). For various printed circuit boards of different forms and different functions, operations such as processing, etching, drilling, and copper plating are selectively performed on copper clad laminates to prepare different printed circuits. The copper clad laminate mainly provides interconnection, conduction, insulation, and support functions for the printed circuit board, and greatly affects a transmission speed, an energy loss, characteristic impedance, and the like of signals in a circuit. Therefore, performance, quality, processability in manufacture, a manufacture level, manufacture costs, and long-term reliability and stability of the printed circuit board depend largely on the copper clad laminate.

The through hole is also referred to as a vertical interconnect access (VIA). In an example, the hole wall of the through hole is plated with a conductive metal layer, which is used to conduct or connect a copper foil line between conductive patterns in different layers of the circuit board. In an example, the through hole can implement copper foil interconnection of a double-sided copper clad laminate, and a printed circuit board finally formed by using the substrate can integrate more devices, thereby greatly improving functional extensibility of the printed circuit board, effectively improving a high density degree of device arrangement, and saving more space.

With reference to the first aspect, in a possible implementation,
  the through hole is not located in an area of the cavity.
  Specifically, an area without a cavity is used to support the entire substrate, so as to meet a mechanical requirement of the printed circuit board. In addition, the through hole is disposed in a specified area without a cavity to ensure that the filler or the cavity is in a closed environment. Such practice aims to avoid a relatively poor hole shape or even copper breakage of a plated through hole, and avoid a solution from pouring into the cavity or an air hole. In addition, excessive moisture absorption by the filler or the cavity is avoided, thereby ensuring electrical performance stability of the filler or the cavity.

With reference to the first aspect, in another possible implementation,
  the filler is a material having a plurality of foamed pores.
  Specifically, the material having foamed pores may be a foam material, or may be another material that can reduce the dielectric constant Dk and the dielectric loss Df. Compared with a conventional polytetrafluoroethylene PTFE substrate or a conventional radio frequency substrate, the printed circuit board formed in this embodiment enables the dielectric constant Dk and the dielectric loss Df to be lower. Compared with a conventional foam material, the printed circuit board formed in this embodiment has higher hardness and mechanical performance due to support by the substrate, and is less prone to bending and deformation.

In addition, because the filler is in a closed environment, in an example in which a foam material is used as the filler, water absorption by the foam material can be avoided. Compared with a foam plate exposed to the outside, the closed filler helps reduce impact of a water absorption rate on the dielectric constant Dk and the dielectric loss Df, thereby ensuring stable electrical performance.

A volume of the filler should not be greater than a volume of the cavity into which the filler is pressed. A tolerance fit between the filler and the size of the cavity may have a plurality of forms, so as to use a function and a mechanical requirement of the printed circuit board as criteria.

With reference to the first aspect, in another possible implementation, a material of the substrate is epoxy resin.

Specifically, a substrate material provided in this embodiment is not limited thereto, and may be a common material used to prepare a printed circuit board in the field. For example, the substrate may be an epoxy resin material, injection molding plastic, or CEM-3, or may be a hydrocarbon material or a PPO material. Costs of the epoxy resin material, the injection molding plastic, and CEM-3 are relatively low, which is conducive to cost control.

With reference to the first aspect, in another possible implementation, a material of the bonding layer is prepreg.

There may be a plurality of materials for the bonding layer. For example, the material may be prepreg (PP) or a bondsheet (BS).

With reference to the first aspect, in another possible implementation, a quantity of through holes is M, and M is an integer greater than or equal to 1.

Specifically, there may be one or more through holes, and the quantity of the through holes may be determined based on an actual need. A size of the through holes and a spacing between the through holes each may have a plurality of forms, and are limited by a through hole standard of a conventional printed circuit board. Details are not described herein again.

With reference to the first aspect, in another possible implementation, a quantity of the cavities is N, and N is an integer greater than or equal to 1.

Specifically, there may be one or more cavities, and all the cavities may have a plurality of forms, for example, including but not limited to: Fillers may be pressed into all of the cavities or some of the cavities, or fillers of different materials may be pressed into the cavities.

According to a second aspect, a preparation method of the printed circuit board according to the first aspect is provided, including the following.

A substrate, a filler, and a bonding layer are first provided to complete material preparation.

Grooving processing is performed on the substrate to form a cavity, where the cavity penetrates through the substrate.

In an example, the grooving processing may be punching processing or milling processing.

The filler is pressed into the cavity: two surfaces of the substrate are covered with a copper foil; and the copper foil is bonded to the substrate by using the bonding layer, to obtain a bonded substrate.

In an example, the step of bonding the copper foil to the substrate is laying-up. A matched plate body obtained after the laying-up is completed is sandwiched between steel plates and conveyed into a pressing furnace. After heating, pressurizing, and then cooling, the steel plates are removed to obtain a composite copper clad laminate (CCL). This technological process is press-fit.

Drilling processing is performed on the bonded substrate to form a through hole, where the through hole penetrates through the bonded substrate.

It should be understood that, the bonded substrate herein further includes a substrate on which bonding and press-fit processing have been performed. In an example, the bonded substrate may be a copper clad laminate (CCL) or a composite copper clad laminate. A hole is drilled at a specified position of the composite copper clad laminate according to a procedure, to form a through hole (VIA) that penetrates through the composite copper clad laminate.

An outer surface of the bonded substrate and an inner wall of the through hole are plated with a conductive metal layer.

It should be understood that, the bonded substrate herein further includes a substrate on which bonding and press-fit processing have been performed. In an example, the bonded substrate may be a copper clad laminate (CCL). After the through hole is disposed, electroplating processing is performed on the composite copper clad laminate. Specifically, copper plated on an outer surface of the copper clad laminate is referred to as surface copper, which is used to provide additional shielding protection and noise control for underlying devices and signals, and in addition, help improve a heat dissipation capability of the printed circuit board. Copper plated on a hole wall of the through hole of the copper clad laminate is referred to as hole copper, and an obtained hole is a plated through hole (PTH). Such a plated through hole can implement interconnection of double-sided printed circuits. Compared with a single-sided circuit board, a double-sided printed circuit board can integrate more electronic devices, thereby greatly improving functional extensibility of the printed circuit board, effectively improving a high density degree of device arrangement, and saving more space. After electroplating processing, a next technology, that is, a printed circuit board manufacturing technological process may be performed on the composite copper clad laminate.

The printed circuit board manufacturing technological process includes a dry film process, an etching process, a solder mask process, a silkscreen process, a profile process, a test process, and another process, to finally form a double-sided printed circuit board. These processes are all conventional technologies, and details are not described herein again.

With reference to the second aspect, in a possible implementation, the through hole is disposed in a specified area without a cavity on the substrate.

Specifically, an area without a cavity is used to support the entire substrate, so as to meet a mechanical requirement of the printed circuit board. In addition, the through hole is disposed in the specified area without a cavity to ensure that the filler or the cavity is in a closed environment. Such practice aims to avoid a relatively poor hole shape or even copper breakage of a plated through hole, and avoid a solution from pouring into the cavity or an air hole. In addition, excessive moisture absorption by the filler or the cavity is avoided, thereby ensuring electrical performance stability of the filler or the cavity.

With reference to the second aspect, in another possible implementation, the filler is a material having a plurality of foamed pores.

Specifically, the material having foamed pores may be a foam material, or may be another material that can reduce a dielectric constant Dk and a dielectric loss Df. Compared with a conventional polytetrafluoroethylene PTFE substrate or a conventional radio frequency substrate, the printed circuit board formed in this embodiment enables the dielectric constant Dk and the dielectric loss Df to be lower, so that Dk<2.0, and Df<0.001. Compared with a conventional foam material, the printed circuit board formed in this embodiment has higher hardness and mechanical performance due to support by the substrate, and is less prone to bending and deformation.

In addition, because the filler is in a closed environment, in an example in which a foam material is used as the filler, water absorbency of the foam material can be avoided. Compared with a foam plate exposed to the outside, the closed filler helps reduce impact of a water absorption rate on the dielectric constant Dk and the dielectric loss Df, thereby ensuring stable electrical performance.

A volume of the filler should not be greater than a volume of the cavity into which the filler is pressed. A tolerance fit between the filler and the size of the cavity may have a plurality of forms, so as to use a function and a mechanical requirement of the printed circuit board as criteria.

With reference to the second aspect, in another possible implementation, a material of the substrate is epoxy resin.

Specifically, a substrate material provided in this embodiment is not limited thereto, and may be a common material used to prepare a printed circuit board in the field. For example, the substrate may be an epoxy resin material, injection molding plastic, or CEM-3, or may be a hydrocarbon material or a PPO material. Costs of the epoxy resin material, the injection molding plastic, and CEM-3 are relatively low, which is conducive to cost control.

With reference to the second aspect, in another possible implementation, a material of the bonding layer is prepreg.

There may be a plurality of materials for the bonding layer. For example, the material may be prepreg (PP) or a bondsheet (BS).

With reference to the second aspect, in another possible implementation, a quantity of through holes is M, and M is an integer greater than or equal to 1.

Specifically, there may be one or more through holes, and the quantity of the through holes may be determined based on an actual need. A size of the through holes and a spacing between the through holes each may have a plurality of forms, and are limited by a through hole standard of a conventional printed circuit board. Details are not described herein again.

With reference to the second aspect, in another possible implementation, a quantity of the cavities is N, and N is an integer greater than or equal to 1.

Specifically, there may be one or more cavities, and all the cavities may have a plurality of forms, for example, including but not limited to: Fillers may be pressed into all of the cavities or some of the cavities, or fillers of different materials may be pressed into the cavities.

According to a third aspect, a printed circuit board is provided. The printed circuit board includes:

a substrate, a bonding layer, and a copper foil, where the substrate is provided with a plug hole, and the plug hole penetrates through the substrate;

the plug hole includes a curable material;

two surfaces of the substrate are covered with the copper foil;

the copper foil is bonded to the substrate by using the bonding layer;

an outer surface of the copper foil is plated with a conductive metal layer;

a position of the plug hole is provided with a through hole, and the through hole penetrates through the substrate and the bonding layer; and a hole wall of the through hole is plated with a conductive metal layer.

Specifically, the through hole is also referred to as a vertical interconnect access (VIA). In an example, the hole wall of the through hole is plated with a conductive metal layer, which is used to conduct or connect a copper foil line between conductive patterns in different layers of the circuit board. In an example, the through hole can implement copper foil interconnection of a double-sided copper clad laminate, and a printed circuit board finally formed by using the substrate can integrate more devices, thereby greatly improving functional extensibility of the printed circuit board, effectively improving a high density degree of device arrangement, and saving more space.

In an example, after the copper foil is bonded to the substrate by using the bonding layer, a press-fit technology is performed to obtain a copper clad laminate (CCL). For various printed circuit boards of different forms and different functions, operations such as processing, etching, drilling, and copper plating are selectively performed on copper clad laminates to prepare different printed circuits. The copper clad laminate mainly provides interconnection, conduction, insulation, and support functions for the printed circuit board, and greatly affects a transmission speed, an energy loss, characteristic impedance, and the like of signals in a circuit. Therefore, performance, quality, processability in manufacture, a manufacture level, manufacture costs, and long-term reliability and stability of the printed circuit board depend largely on the copper clad laminate.

With reference to the third aspect, in a possible implementation, the substrate is a material having a plurality of foamed pores.

Specifically, the material having foamed pores may be a foam material, or may be another material that can reduce a dielectric constant Dk and a dielectric loss Df. Compared with a conventional polytetrafluoroethylene PTFE substrate or a conventional radio frequency substrate, the printed circuit board formed in this embodiment enables the dielectric constant Dk and the dielectric loss Df to be lower, so that Dk<2.0, and Df<0.001. Compared with a conventional foam material, the printed circuit board formed in this embodiment has higher hardness and mechanical performance due to support by the curable material, and is less prone to bending and deformation.

With reference to the third aspect, in another possible implementation, the curable material is resin ink.

Specifically, the curable material may be a liquid substance, for example, may be resin ink: or may be a solid substance, for example, epoxy, hydrocarbon, or PPO. The curable material is used to support the entire substrate, so as to meet a mechanical requirement of the printed circuit board. In addition, the plug hole penetrates through the substrate to ensure that the filler or the cavity is in a closed environment. Such practice aims to avoid a relatively poor hole shape or even copper breakage of a plated through hole, and avoid a solution from pouring into the cavity or an air hole. In addition, excessive moisture absorption by the filler or the cavity is avoided, thereby ensuring electrical performance stability of the filler or the cavity. In an example in which a foam material is used as the filler, water absorbency of the foam material can be avoided. Compared with a foam plate exposed to the outside, the closed filler helps reduce impact of a water absorption rate on the dielectric constant Dk and the dielectric loss Df, thereby ensuring stable electrical performance.

With reference to the third aspect, in another possible implementation, a material of the bonding layer is prepreg.

There may be a plurality of materials for the bonding layer. For example, the material may be prepreg (PP) or a bondsheet (BS).

With reference to the third aspect, in another possible implementation, a quantity of plug holes is K, and K is any integer greater than or equal to 1.

Specifically, there may be one or more plug holes, and the quantity of the plug holes may be determined based on an actual need. A spacing between the plug holes may have a plurality of forms, and is limited by a through hole standard of a conventional printed circuit board. Details are not described herein again.

With reference to the third aspect, in another possible implementation, a quantity of through holes is M, M is any integer greater than or equal to 1, and the quantity of the through holes is less than or equal to the quantity of the plug holes.

With reference to the third aspect, in another possible implementation, a radius of the plug hole is less than or equal to 0.6 mm; and the radius of the plug hole is greater than a radius of the through hole. In an example, a difference between the radius of the plug hole and the radius of the through hole should be greater than or equal to 0.15 mm.

With reference to the third aspect, in another possible implementation, an axis of the plug hole and an axis of the through hole are a same straight line. An objective of such practice is to ensure mechanical stability of the plug hole serving as a support body.

According to a fourth aspect, a preparation method of the printed circuit board according to the third aspect is provided, including the following.

A substrate, a bonding layer, and a copper foil are provided to complete material preparation.

Drilling processing is performed on the substrate to form a plug hole, where the plug hole penetrates through the substrate.

A curable material is added into the plug hole.

Two surfaces of the substrate are covered with the copper foil.

The copper foil is bonded to the substrate by using a bonding layer, to obtain a bonded substrate.

In an example, the step of bonding the copper foil to the substrate is laying-up. A matched plate body obtained after the laying-up is completed is sandwiched between steel plates and conveyed into a pressing furnace. After being heated, pressurized, and then cooled, the steel plates are removed to obtain a composite copper clad laminate (CCL). This technological process is press-fit.

Drilling processing is performed at a position of the plug hole on the bonded substrate to form a through hole, where the through hole penetrates through the bonded substrate.

It should be understood that, the bonded substrate herein further includes a substrate on which bonding and press-fit processing have been performed. In an example, the bonded substrate may be a copper clad laminate (CCL) or a composite copper clad laminate. A hole is drilled at a specified position of the composite copper clad laminate according to a procedure, to form a through hole (VIA) that penetrates through the composite copper clad laminate.

An outer surface of the bonded substrate and an inner wall of the through hole are plated with a conductive metal layer.

It should be understood that, the bonded substrate herein further includes a substrate on which bonding and press-fit processing have been performed. In an example, the bonded substrate may be a copper clad laminate (CCL). After the through hole is disposed, electroplating processing is performed on the composite copper clad laminate. Specifically, copper plated on an outer surface of the copper clad laminate is referred to as surface copper, which is used to provide additional shielding protection and noise control for underlying devices and signals, and in addition, help improve a heat dissipation capability of the printed circuit board. Copper plated on a hole wall of the through hole of the copper clad laminate is referred to as hole copper, and an obtained hole is a plated through hole (PTH). Such a plated through hole can implement interconnection of double-sided printed circuits. Compared with a single-sided circuit board, a double-sided printed circuit board can integrate more electronic devices, thereby greatly improving functional extensibility of the printed circuit board, effectively improving a high density degree of device arrangement, and saving more space. After electroplating processing, a next technology, that is, a printed circuit board manufacturing technological process may be performed on the composite copper clad laminate.

The printed circuit board manufacturing technological process includes a dry film process, an etching process, a solder mask process, a silkscreen process, a profile process, a test process, and another process, to finally form a double-sided printed circuit board. These processes are all conventional technologies, and details are not described herein again.

With reference to the fourth aspect, in a possible implementation, the substrate is a material having a plurality of foamed pores.

Specifically, the material having foamed pores may be a foam material, or may be another material that can reduce a dielectric constant Dk and a dielectric loss Df. Compared with a conventional polytetrafluoroethylene PTFE substrate or a conventional radio frequency substrate, the printed circuit board formed in this embodiment enables the dielectric constant Dk and the dielectric loss Df to be lower, so that $Dk<2.0$, and $Df<0.001$. Compared with a conventional foam material, the printed circuit board formed in this embodiment has higher hardness and mechanical performance due to support by the curable material, and is less prone to bending and deformation.

With reference to the fourth aspect, in another possible implementation, the curable material is resin ink.

Specifically, the curable material may be a liquid substance, for example, may be resin ink: or may be a solid substance, for example, epoxy, hydrocarbon, or PPO. The curable material is used to support the entire substrate, so as to meet a mechanical requirement of the printed circuit board. In addition, the plug hole penetrates through the substrate to ensure that the filler or the cavity is in a closed environment. Such practice aims to avoid a relatively poor hole shape or even copper breakage of a plated through hole, and avoid a solution from pouring into the cavity or an air hole. In addition, excessive moisture absorption by the filler or the cavity is avoided, thereby ensuring electrical performance stability of the filler or the cavity. In an example in which a foam material is used as the filler, water absorbency of the foam material can be avoided. Compared with a foam plate exposed to the outside, the closed filler helps reduce impact of a water absorption rate on the dielectric constant Dk and the dielectric loss Df, thereby ensuring stable electrical performance.

With reference to the fourth aspect, in another possible implementation, a material of the bonding layer is prepreg.

There may be a plurality of materials for the bonding layer. For example, the material may be prepreg (PP) or a bondsheet (BS).

With reference to the fourth aspect, in another possible implementation, a quantity of plug holes is K, and K is any integer greater than or equal to 1.

Specifically, there may be one or more plug holes, and the quantity of the plug holes may be determined based on an actual need. A spacing between the plug holes may have a plurality of forms, and is limited by a through hole standard of a conventional printed circuit board. Details are not described herein again.

With reference to the fourth aspect, in another possible implementation, a quantity of through holes is M, M is any integer greater than or equal to 1, and the quantity of the through holes is less than or equal to the quantity of the plug holes.

With reference to the fourth aspect, in another possible implementation, a radius of the plug hole is less than or equal to 0.6 mm; and the radius of the plug hole is greater than a radius of the through hole. A difference between the radius of the plug hole and the radius of the through hole should be greater than or equal to 0.15 mm.

With reference to the fourth aspect, in another possible implementation, an axis of the plug hole and an axis of the through hole are a same straight line. An objective of such practice is to ensure mechanical stability of the plug hole serving as a support body.

According to a fifth aspect, a preparation method of the printed circuit board according to the third aspect is provided, including the following.

A substrate, a bonding layer, and a copper foil are provided to complete material preparation.

Two surfaces of the substrate are covered with the copper foil.

The copper foil is bonded to the substrate by using a bonding layer, to obtain a bonded substrate.

Press-fit processing is performed on the bonded substrate to obtain a press-fitted substrate.

Drilling processing is performed on the press-fitted substrate to form a plug hole, where the plug hole penetrates through the press-fitted substrate.

A curable material is added into the plug hole.

Drilling processing is performed at a position of the plug hole on the press-fitted substrate to form a through hole, where the through hole penetrates through the bonded substrate.

An outer surface of the bonded substrate and an inner wall of the through hole are plated with a conductive metal layer.

A printed circuit board manufacturing technology is performed on a plate body obtained through the metallization processing to obtain a double-sided printed circuit board.

Specifically, a difference between the preparation method provided in the fifth aspect and the preparation method provided in the fourth aspect lies in that the preparation method in the fifth aspect uses a technology of performing press-fit before drilling. In this method, after hole fill of the curable material is completed on the substrate, grinding processing needs to be performed once, so that a surface of the plate body is flatter in a drilling process, and this is more conducive to subsequent copper plating processing. Except for a sequence and the foregoing grinding processing process, features of the preparation method in the fifth aspect are consistent with those of the preparation method provided in the fourth aspect, and details are not described herein again.

BRIEF DESCRIPTION OF DRAWINGS

To describe the technical solutions in the embodiments of this disclosure or in the conventional technology more clearly, the following briefly describes the accompanying drawings needed for describing the embodiments. Clearly, the accompanying drawings in the following description show merely some embodiments of this disclosure, and a person of ordinary skill in the art may derive other drawings from these accompanying drawings without creative efforts.

FIG. 2 is a schematic flowchart of a manufacturing method based on the printed circuit board in FIG. 1 according to an embodiment of this disclosure;

FIG. 3 is a schematic flowchart of another manufacturing method based on the printed circuit board in FIG. 1 according to an embodiment of this disclosure;

DESCRIPTION OF EMBODIMENTS

Figure 1:
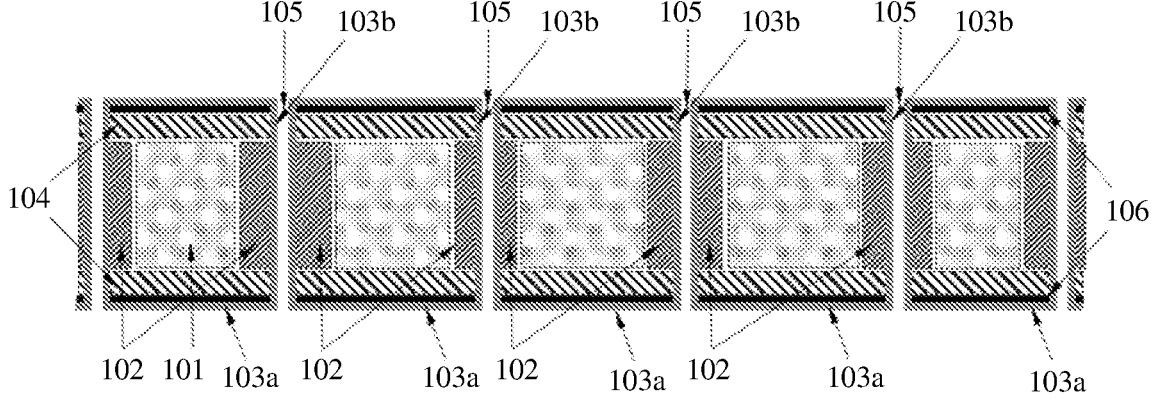
FIG. 1 is a schematic diagram of a structure of a printed circuit board according to an embodiment of this disclosure.

The following further describes the solutions provided in this disclosure with reference to the accompanying drawings and embodiments. It should be understood that a system structure and a service scenario provided in embodiments of this disclosure are mainly intended to explain some possible implementations of the technical solutions of this disclosure, and should not be construed as a uniqueness limitation on the technical solutions of this disclosure. A person of ordinary skill in the art may learn that, with evolution of systems and emergence of new service scenarios, technical solutions provided in this disclosure are also applicable to same or similar technical problems.

It should be understood that, some repetition parts of the technical solutions provided in the embodiments of this disclosure may not be described again in the description of the following specific embodiments. However, it should be considered that these specific embodiments have been mutually referenced and may be mutually combined.

In a wireless communication system, devices may be classified into devices that provide a wireless network service and devices that use a wireless network service. The devices that provide a wireless network service are devices that form a wireless communication network, and may be briefly referred to as network equipment or network elements. The network equipment usually belong to operators or infrastructure providers and are operated or maintained by the vendors. The network equipment may further be classified into a radio access network (RAN) device and a core network (CN) device. A typical RAN device includes a base station (BS).

An antenna printed circuit board requires a medium to have a lower dielectric constant Dk and a lower dielectric loss Df and also feature cost-competitiveness and higher processability. Currently, an antenna printed circuit board uses a radio-frequency material dedicated for an antenna. A dielectric constant Dk and a dielectric loss Df are determined by a thickness of the material. There are a few optional thickness specifications for a medium material. For example, the optional specifications are 0.005 inches, 0.010 inches, 0.020 inches, 0.030 inches, and 0.060 inches. Therefore, it is difficult for the dielectric constant Dk and the dielectric loss Df to reach an expected range and to be further adjusted.

Among materials available for the antenna printed circuit board, currently, polytetrafluoroethylene PTFE resin is resin with a lowest dielectric constant Dk (Dk is about 2.1). A material with a dielectric constant Dk less than 2.0 needs to be implemented by using a foamed medium or a cavity. Among all media, air has lowest Dk/Df, and increasing a proportion of air can effectively reduce Dk/Df. Therefore, foaming by using matrix resin with a low dielectric constant Dk is an effective way to obtain a medium with an ultra-low dielectric constant Dk. A higher foaming rate leads to a higher proportion of air and lower Dk/Df.

For the foregoing principle, this disclosure provides a printed circuit board and a preparation method thereof, and an electronic communication device, so as to further reduce a dielectric loss of the printed circuit board while ensuring cost control.

The following clearly describes technical solutions in embodiments of this disclosure with reference to accompanying drawings in the embodiments of this disclosure. Clearly, described embodiments are merely some rather than all of the embodiments of this disclosure. All other embodiments obtained by a person of ordinary skill in the art based on the embodiments of this disclosure without creative efforts all fall within the protection scope of this disclosure.

Some embodiments of this disclosure provide a printed circuit board. As shown in FIG. 1, the printed circuit board includes the following.

A printed circuit board includes a substrate 102, a bonding layer 104, a copper foil 106, and a filler 101.

The substrate 102 is provided with a cavity (not shown in the figure), and the cavity penetrates through the substrate 102.

Two surfaces of the substrate 102 are covered with the copper foil 106.

The copper foil 106 is bonded to the substrate 102 by using the bonding layer 104 to form a bonded substrate, which is a copper clad laminate in an example.

An outer surface of the copper clad laminate is plated with a conductive metal layer 103a.

The filler 101 is located in the cavity.

The substrate 102 is provided with a through hole 105, and the through hole 105 penetrates through the substrate 102 and the bonding layer 104, to connect the copper foils 106 on both faces of the printed circuit board.

A hole wall of the through hole 105 is plated with a conductive metal layer.

Specifically, the substrate 102 in this embodiment may be a common material used to prepare a printed circuit board in the field. For example, the substrate 102 may be an epoxy resin material or injection molding plastic, or may be a composite board such as CEM-3 or FR-4, or may be a hydrocarbon material or a PPO material.

In an example, a groove body may be formed on the substrate 102 by grooving, and the groove body penetrates through the substrate 102. Because the bonding layer 104, the copper foil 106, and a copper-plated layer are separately provided above and below the groove body, the groove body forms a closed cavity in the printed circuit board. A part, of the substrate 102, that has no groove disposed serves as a basic structure of the printed circuit board, and is used to support the printed circuit board.

The embodiment shown in FIG. 1 shows five cavities. It should be understood that, the substrate 102 may be provided with a plurality of cavities. A size and a spacing of the cavities are selected based on a need and a requirement of a conventional technology. An area, of the substrate 102, that has no groove disposed is a supporting part of the printed circuit board.

The filler may be pressed into the cavity, or an empty-cavity state may be maintained. In the empty-cavity state, a dielectric constant Dk and a dielectric loss Df of the printed circuit board prepared by using the substrate can be effectively reduced, so that Dk<2.0 and Df<0.001. This improves radio frequency performance and radio frequency efficiency. Similarly, the filler may be a material that can reduce the dielectric constant Dk and the dielectric loss Df, thereby also improving the radio frequency performance and the radio frequency efficiency.

The filler 101 in this embodiment may be a plurality of materials. For example, the material may be a material having a plurality of foamed pores, such as a foam material or another material that can reduce the dielectric loss.

In the embodiment shown in FIG. 1, there may be a plurality of materials for the bonding layer 104. For example, the material of the bonding layer 104 may be prepreg (PP) or a bondsheet (BS). The bonding layer 104 is configured to bond the substrate 102 and the copper foil 106. The copper foil 106 is configured to implement a circuit layout on the printed circuit board. By using a series of processing technologies such as press-fit, the finally formed substrate 102 and the copper foil 106 bonded to the substrate 102 together form a copper clad laminate (CCL). Such a composite copper clad laminate has higher hardness and a better supporting effect, and is not prone to bending and deformation. In addition, due to presence of the filler material, the composite copper clad laminate has a lower dielectric constant (Dk) and dielectric loss (Df) and more excellent radio frequency performance and radio frequency efficiency. Moreover, autonomous adjustment of Dk and Df can be implemented, so that a degree of freedom is higher in design. In addition, the printed circuit board obtained by processing the composite copper clad laminate has lower costs.

A required circuit layout may be obtained by etching the copper foil 106 on the copper clad laminate by using an etching technology. In the embodiment shown in FIG. 1, both faces of the substrate 102 are covered with the copper foil 106, and the through hole 105 that penetrates through the entire substrate 102 and the bonding layer 104 is disposed on the substrate 102.

Such a through hole 105 plated with a conductive metal layer is a plated through hole (PTH). Such a plated through hole can implement interconnection of double-sided printed circuits. Compared with a single-sided circuit board, a double-sided printed circuit board can integrate more electronic devices, thereby greatly improving functional extensibility of the printed circuit board, effectively improving a high density degree of device arrangement, and saving more space.

An objective of the electroplating is to ensure that the filler 101 is in a closed environment, and a non-cavity area can withstand mechanical impact caused by a drilling technology, so as to ensure implementation of a subsequent technology. The material (for example, a foam material) of the filler 101 has a relatively high water absorption rate. With environmental impact, a water absorption degree greatly affects changes of the dielectric constant Dk and the dielectric loss Df, easily causing electrical performance failures. In this embodiment, as shown in FIG. 1, because the through hole 105 is disposed in a specified area, on the substrate 102, that has no groove disposed, the filler 101 can be closed. This avoids the water absorption rate of the filler 101 from increasing due to exposure to the outside, thereby greatly improving reliability of electrical performance and stability of the dielectric constant Dk and the dielectric loss Df.

An embodiment of this disclosure provides a preparation method of the printed circuit board shown in FIG. 1. As shown in FIG. 2, a substrate, a filler, and a bonding layer are first provided to complete material preparation. The method further includes the following steps.

Grooving processing is performed on the substrate to form a cavity, where the cavity penetrates through the substrate.

In an example, the grooving processing may be punching processing or milling processing.

The filler is pressed into the cavity: two surfaces of the substrate are covered with a copper foil; and the copper foil is bonded to the substrate by using the bonding layer, to obtain a bonded substrate.

In an example, the step of bonding the copper foil to the substrate is laying-up. A matched plate body obtained after the laying-up is completed is sandwiched between steel plates and conveyed into a pressing furnace. After being heated, pressurized, and then cooled, the steel plates are removed to obtain a composite copper clad laminate (CCL). This technological process is press-fit.

Drilling processing is performed on the bonded substrate to form a through hole, where the through hole penetrates through the bonded substrate.

It should be understood that, the bonded substrate herein further includes a substrate on which bonding and press-fit processing have been performed. In an example, the bonded substrate may be a copper clad laminate (CCL) or a composite copper clad laminate. A hole is drilled at a specified position of the composite copper clad laminate according to a procedure, to form a through hole (VIA) that penetrates through the composite copper clad laminate.

An outer surface of the bonded substrate and an inner wall of the through hole are plated with a conductive metal layer.

It should be understood that, the bonded substrate herein further includes a substrate on which bonding and press-fit processing have been performed. In an example, the bonded substrate may be a copper clad laminate (CCL). After the through hole is disposed, electroplating processing is performed on the composite copper clad laminate. Specifically, copper plated on an outer surface of the copper clad laminate is referred to as surface copper, which is used to provide additional shielding protection and noise control for underlying devices and signals, and in addition, help improve a heat dissipation capability of the printed circuit board. Copper plated on a hole wall of the through hole of the copper clad laminate is referred to as hole copper, and an obtained hole is a plated through hole (PTH). Such a plated through hole can implement interconnection of double-sided printed circuits. Compared with a single-sided circuit board, a double-sided printed circuit board can integrate more electronic devices, thereby greatly improving functional extensibility of the printed circuit board, effectively improving a high density degree of device arrangement, and saving more space. After electroplating processing, a next technology, that is, a printed circuit board manufacturing technological process may be performed on the composite copper clad laminate.

In the embodiment shown in FIG. 2, a conventional printed circuit board manufacturing technological process is further included. The process includes a dry film process, an etching process, a solder mask process, a silkscreen process, a profile process, a test process, and another process, to finally form a double-sided printed circuit board. These processes are all conventional technologies, and details are not described herein again.

Another embodiment of this disclosure provides a preparation method. The preparation method is based on the structure of the printed circuit board in the embodiment shown in FIG. 1. As shown in FIG. 3, this embodiment is specific to a preparation method in which a matrix is injection molding plastic. A difference between this embodiment and the embodiment shown in FIG. 2 is that the substrate 102 with a cavity is formed by processing by using an injection molding process rather than by grooving. Specifically, as shown in step 1 in FIG. 3, after injection molding is performed on the substrate 102, demolding is performed to obtain the substrate 102 that is of injection molding plastic and that has a cavity. In addition, step 1 shown in FIG. 2 is omitted because the cavity has been formed in a mold by using the injection molding process and there is no need to perform grooving processing.

Figure 4:
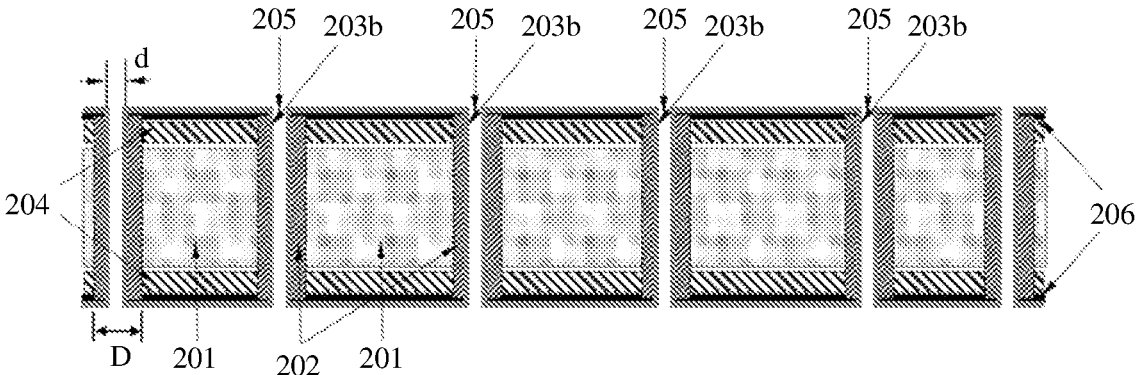
FIG. 4 is a schematic diagram of a structure of another printed circuit board according to an embodiment of this disclosure.

Some embodiments of this disclosure provide a printed circuit board. As shown in FIG. 4, a substrate 201, a bonding layer 204, and a copper foil 206 are included.

A plug hole (an area with a diameter D in the figure) is disposed at a specified position of the substrate 201. The plug hole penetrates through the substrate 201. The plug hole is configured to inject a curable material 202, and the curable material 202 is configured to support the printed circuit board.

Two opposite surfaces of the substrate 201 are covered with the copper foil 206.

The copper foil 206 is bonded to the substrate 201 by using the bonding layer 204 to form a copper clad laminate.

An outer surface of the copper foil 206 is plated with a conductive metal layer.

The position of the plug hole is provided with a through hole 205, and the through hole 205 penetrates through the substrate 201 and the bonding layer 104, to connect the copper foils 206 on both faces of the printed circuit board.

A hole wall of the through hole 205 is plated with a conductive metal layer.

In an example, the substrate 201 is a material having a plurality of foamed pores in this embodiment. Specifically, the material having foamed pores may be a foam material, or may be another material that can reduce a dielectric constant Dk and a dielectric loss Df. Compared with a conventional polytetrafluoroethylene PTFE substrate or a conventional radio frequency substrate, the printed circuit board formed in this embodiment enables the dielectric constant Dk and the dielectric loss Df to be lower, so that Dk<2.0, and Df<0.001.

In an example, the curable material 202 may be a liquid substance, for example, may be resin ink: or may be a solid substance, for example, epoxy; hydrocarbon, or PPO. The curable material 202 is used to support the entire substrate, so as to meet a mechanical requirement of the printed circuit board. In addition, the plug hole penetrates through the substrate 201 to ensure that the filler or the cavity is in a closed environment. Such practice aims to avoid a relatively poor hole shape or even copper breakage of a plated through hole, and avoid a solution from pouring into the cavity or an air hole. In addition, excessive moisture absorption by the filler or the cavity is avoided, thereby ensuring electrical performance stability of the filler or the cavity. In an example in which a foam material is used as the filler, water absorbency of the foam material can be avoided. Compared with a foam plate exposed to the outside, the closed filler helps reduce 0 impact of a water absorption rate on the dielectric constant Dk and the dielectric loss Df, thereby ensuring stable electrical performance.

In FIG. 4, there are six plug holes. It should be understood that, there may be one or more plug holes, and the quantity of the plug holes may be determined based on an actual need. A spacing between the plug holes may have a plurality of forms, and is limited by a through hole standard of a conventional printed circuit board. Details are not described herein again. There may be one or more through holes 205, but a quantity of the through holes 205 is less than or equal to the quantity of the plug holes. This is because the through hole 205 is disposed in a support structure rather than the substrate in the solution provided in this embodiment.

In an example, a radius of the plug hole is less than or equal to 0.6 mm; and the radius of the plug hole is greater than a radius of the through hole 205. A difference between the radius of the plug hole and the radius of the through hole 205 should be greater than or equal to 0.15 mm.

In an example, an axis of the plug hole and an axis of the through hole 205 are a same straight line. An objective of such practice is to ensure mechanical stability of the plug hole serving as a support body.

In an example, the hole wall of the through hole 205 is plated with a conductive metal layer, which is used to implement double-sided interconnection of the copper foils on both faces by using the through hole 205, and a printed circuit board finally formed by using the substrate can integrate more devices, thereby greatly improving functional extensibility of the printed circuit board, effectively improving a high density degree of device arrangement, and saving more space.

Figure 5:
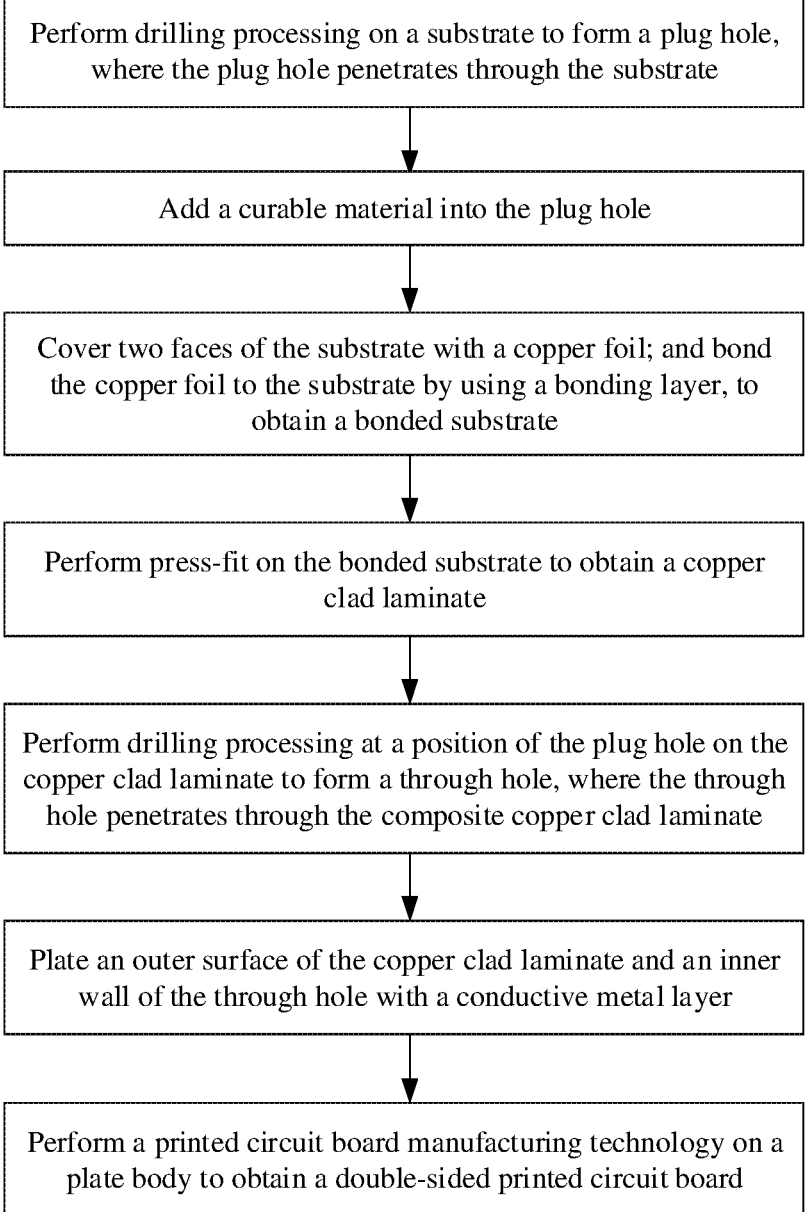
FIG. 5 is a schematic flowchart of a manufacturing method based on the printed circuit board in FIG. 4 according to an embodiment of this disclosure.

An embodiment of this disclosure provides a preparation method of the printed circuit board shown in FIG. 4. As shown in FIG. 5, a substrate, a bonding layer, and a copper foil are first provided to complete material preparation. The method further includes the following steps.

Drilling processing is performed on the substrate to form a plug hole, where the plug hole penetrates through the substrate.

A curable material is added into the plug hole.

Two surfaces of the substrate are covered with the copper foil.

The copper foil is bonded to the substrate by using the bonding layer, to obtain a bonded substrate.

In an example, the step of bonding the copper foil to the substrate is laying-up. A matched plate body obtained after the laying-up is completed is sandwiched between steel plates and conveyed into a pressing furnace. After being heated, pressurized, and then cooled, the steel plates are removed to obtain a composite copper clad laminate (CCL). This technological process is press-fit.

Drilling processing is performed at a position of the plug hole on the bonded substrate to form a through hole, where the through hole penetrates through the bonded substrate.

It should be understood that, the bonded substrate further includes a substrate on which bonding and press-fit processing have been performed. In an example, the bonded substrate may be a copper clad laminate (CCL) or a composite copper clad laminate. A hole is drilled at a specified position of the composite copper clad laminate according to a procedure, to form a through hole (VIA) that penetrates through the composite copper clad laminate.

An outer surface of the bonded substrate and an inner wall of the through hole are plated with a conductive metal layer.

It should be understood that, the bonded substrate herein further includes a substrate on which bonding and press-fit processing have been performed. In an example, the bonded substrate may be a copper clad laminate (CCL). After the through hole is disposed, electroplating processing is performed on the composite copper clad laminate. Specifically, copper plated on an outer surface of the copper clad laminate is referred to as surface copper, which is used to provide additional shielding protection and noise control for underlying devices and signals, and in addition, help improve a heat dissipation capability of the printed circuit board. Copper plated on a hole wall of the through hole of the copper clad laminate is referred to as hole copper, and an obtained hole is a plated through hole (PTH). Such a plated through hole can implement interconnection of double-sided printed circuits. Compared with a single-sided circuit board, a double-sided printed circuit board can integrate more electronic devices, thereby greatly improving functional extensibility of the printed circuit board, effectively improving a high density degree of device arrangement, and saving more space. After electroplating processing, a next technology, that is, a printed circuit board manufacturing technological process may be performed on the composite copper clad laminate.

The printed circuit board manufacturing technological process includes a dry film process, an etching process, a solder mask process, a silkscreen process, a profile process, a test process, and another process, to finally form a double-sided printed circuit board. These processes are all conventional technologies, and details are not described herein again.

In a possible implementation,
the substrate is a material having a plurality of foamed pores.

Specifically, the material having foamed pores may be a foam material, or may be another material that can reduce a dielectric constant Dk and a dielectric loss Df. Compared with a conventional polytetrafluoroethylene PTFE substrate or a conventional radio frequency substrate, the printed circuit board formed in this embodiment enables the dielectric constant Dk and the dielectric loss Df to be lower, so that Dk<2.0, and Df<0.001. Compared with a conventional foam material, the printed circuit board formed in this embodiment has higher hardness and mechanical performance due to support by the curable material, and is less prone to bending and deformation.

The printed circuit board manufacturing technological process in FIG. 5 includes a dry film process, an etching process, a solder mask process, a silkscreen process, a profile process, a test process, and another process, to finally form a double-sided printed circuit board. These processes are all conventional technologies, and details are not described herein again.

In an example, the substrate is a material having a plurality of foamed pores.

Specifically, the material having foamed pores may be a foam material, or may be another material that can reduce the dielectric constant Dk and the dielectric loss Df. Compared with a conventional polytetrafluoroethylene PTFE substrate or a conventional radio frequency substrate, the printed circuit board formed in this embodiment enables the dielectric constant Dk and the dielectric loss Df to be lower, so that Dk<2.0, and Df<0.001.

In an example, the curable material is resin ink.

Specifically, the curable material may be a liquid substance, for example, may be resin ink: or may be a solid substance, for example, epoxy, hydrocarbon, or PPO. The curable material is used to support the entire substrate, so as to meet a mechanical requirement of the printed circuit board. In addition, the plug hole penetrates through the substrate to ensure that a filler or a cavity is in a closed environment. Such practice aims to avoid a relatively poor hole shape or even copper breakage of a plated through hole, and avoid a solution from pouring into the cavity or an air hole. In addition, excessive moisture absorption by the filler or the cavity is avoided, thereby ensuring electrical performance stability of the filler or the cavity. In an example in which a foam material is used as the filler, water absorbency of the foam material can be avoided. Compared with a foam plate exposed to the outside, the closed filler helps reduce impact of a water absorption rate on the dielectric constant Dk and the dielectric loss Df, thereby ensuring stable electrical performance.

In an example, there may be one or more plug holes, and a quantity of the plug holes may be determined based on an actual need. A spacing between the plug holes may have a plurality of forms, and is limited by a through hole standard of a conventional printed circuit board. Details are not described herein again.

In an example, there may be one or more through holes, but a quantity of the through holes is less than or equal to the quantity of the plug holes.

In an example, a radius of the plug hole is less than or equal to 0.6 mm; and the radius of the plug hole is greater than a radius of the through hole. A difference between the radius of the plug hole and the radius of the through hole should be greater than or equal to 0.15 mm.

In an example, an axis of the plug hole and an axis of the through hole are a same straight line. An objective of such practice is to ensure mechanical stability of the plug hole serving as a support body.

Figure 6:
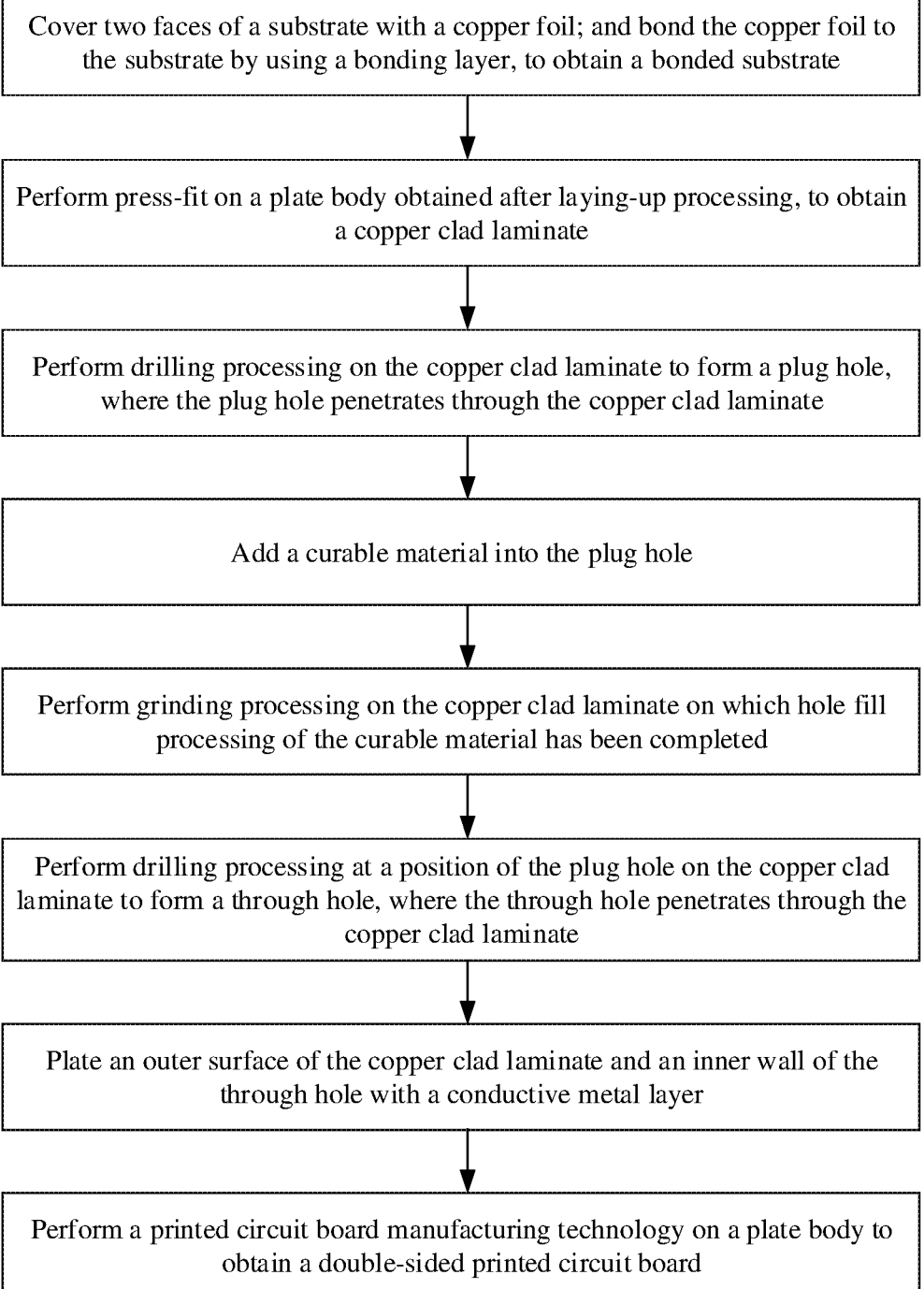
FIG. 6 is a schematic flowchart of another manufacturing method based on the printed circuit board in FIG. 4 according to an embodiment of this disclosure.

An embodiment of this disclosure provides another preparation method of the printed circuit board shown in FIG. 4. As shown in FIG. 6, a substrate, a bonding layer, and a copper foil are first provided to complete material preparation. The method further includes the following steps.

Two surfaces of the substrate are covered with the copper foil.

The copper foil is bonded to the substrate by using the bonding layer, to obtain a bonded substrate.

In an example, the step of bonding the copper foil to the substrate is laying-up. A matched plate body obtained after the laying-up is completed is sandwiched between steel plates and conveyed into a pressing furnace. After being heated, pressurized, and then cooled, the steel plates are removed to obtain a composite copper clad laminate (CCL). This technological process is press-fit.

Press-fit is performed on the plate body obtained through the laying-up processing, to obtain a copper clad laminate.

Drilling processing is performed on the copper clad laminate to form a plug hole, where the plug hole penetrates through the bonded substrate.

It should be understood that, the bonded substrate herein further includes a substrate on which bonding and press-fit processing have been performed. In an example, the bonded substrate may be a copper clad laminate (CCL) or a composite copper clad laminate.

A curable material is added into the plug hole, and hole fill processing of the curable material is completed after the material is cured.

Grinding processing is performed on the copper clad laminate on which hole fill processing of the curable material has been completed.

Drilling processing is performed at a position of the plug hole on the copper clad laminate to form a through hole, where the through hole penetrates through the copper clad laminate.

An outer surface of the copper clad laminate and an inner wall of the through hole are plated with a conductive metal layer.

A printed circuit board manufacturing technology is performed on a plate body obtained through the metallization processing to obtain a double-sided printed circuit board.

In the method provided in this embodiment, after hole fill of the curable material is completed on the substrate, grinding processing needs to be performed once, so that a surface of the plate body is flatter in a drilling process, and this is more conducive to subsequent copper plating processing. Except for a sequence and the foregoing grinding processing process, features of the preparation method shown in FIG. 6 are consistent with those of the preparation method shown in FIG. 5, and details are not described herein again.

The above descriptions are merely specific implementations of this disclosure, and are not intended to limit the protection scope of this disclosure. The modifications or replacements readily figured out by a person skilled in the art within the technical scope disclosed in this disclosure shall all fall within the protection scope of this disclosure. Therefore, the protection scope of this disclosure shall be subject to the protection scope of the claims.

What is claimed is:

1. A printed circuit board comprising a substrate, a bonding layer, a copper foil, and a filler, wherein the substrate is provided with a cavity, and the cavity penetrates through the substrate;

two surfaces of the substrate are covered with the copper foil;

the copper foil is bonded to the substrate by using the bonding layer;

an outer surface of the copper foil is plated with a first conductive metal layer;

the filler is located inside the cavity;

the substrate is provided with a through hole, and the through hole penetrates through the substrate and the bonding layer; and a hole wall of the through hole is plated with a second conductive metal layer;

the filler is a material having a plurality of foamed pores, and the filler has a dielectric constant (Dk) less than 2.0 and has a dielectric loss (Df) less than 0.001.

2. The printed circuit board according to claim 1, wherein the through hole is not located in an area of the cavity.

3. The printed circuit board according to claim 1, wherein a material of the substrate is epoxy resin.

4. The printed circuit board according to claim 1, wherein a material of the bonding layer is prepreg.

5. The printed circuit board according to claim 1, wherein: the filler is enclosed in a closed environment.

6. The printed circuit board according to claim 1, wherein:

the substrate is provided with a plurality of cavities, a respective filler being located inside each of the plurality of cavities;

the substrate is provided with a plurality of through holes each of which is plated with the second conductive metal layer; and each of the cavities is spaced apart in the substrate from each of the through holes.

7. The printed circuit board according to claim 1, wherein both of the first and second conductive metal layers comprise copper.

8. An electronic communication device comprising: an antenna and a printed circuit board, wherein:

the printed circuit board comprises a substrate, a bonding layer, a copper foil, and a filler;

the substrate is provided with a cavity, and the cavity penetrates through the substrate;

two surfaces of the substrate are covered with the copper foil;

the copper foil is bonded to the substrate by using the bonding layer;

an outer surface of the copper foil is plated with a first conductive metal layer;

the filler is located inside the cavity;

the substrate is provided with a through hole, and the through hole penetrates through the substrate and the bonding layer; and a hole wall of the through hole is plated with a second conductive metal layer;

the filler is a material having a plurality of foamed pores; and the filler has a dielectric constant (Dk) less than 2.0 and has a dielectric loss (Df) less than 0.001.

9. The electronic communication device according to claim 8, wherein the through hole of the printed circuit board is not located in an area of the cavity.

10. The electronic communication device according to claim 8, wherein a material of the substrate of the printed circuit board is epoxy resin.

11. The electronic communication device according to claim 8, wherein a material of the bonding layer of the printed circuit board is prepreg.

12. The electronic communication device according to claim 8, wherein:

the filler is enclosed in a closed environment.

13. A printed circuit board comprising a substrate, a bonding layer, a copper foil, and a filler, wherein the substrate is provided with a cavity, and the cavity penetrates through the substrate;

two surfaces of the substrate are covered with the copper foil;

the copper foil is bonded to the substrate by using the bonding layer;

an outer surface of the copper foil is plated with a first conductive metal layer;

the filler is located inside the cavity;

the substrate is provided with a through hole, and the through hole penetrates through the substrate and the bonding layer;

a hole wall of the through hole is plated with a second conductive metal layer;

the substrate is provided with a plurality of cavities, a respective filler is located inside of each one of the plurality of cavities;

a first filler is located inside of a first cavity of the plurality of cavities;

a second filler is located inside of a second cavity of the plurality of cavities; and the first filler is a different material than the second filler.

14. The printed circuit board according to claim 13, wherein:

the filler is enclosed in a closed environment.

15. The printed circuit board according to claim 13, wherein:

the through hole is not located in an area of the cavity.

16. The printed circuit board according to claim 13, wherein:

a material of the substrate is epoxy resin.

17. The printed circuit board according to claim 13, wherein:

a material of the bonding layer is prepreg.

18. The printed circuit board according to claim 13, wherein:

the filler is a material having a plurality of foamed pores.

* * * * *